United States Patent
Iwamoto

(10) Patent No.: US 9,667,209 B2
(45) Date of Patent: May 30, 2017

(54) AMPLIFYING DEVICE AND OFFSET VOLTAGE CORRECTION METHOD

(71) Applicant: FUJI ELECTRIC CO., LTD., Kawasaki-shi (JP)

(72) Inventor: Motomitsu Iwamoto, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/884,209

(22) Filed: Oct. 15, 2015

(65) Prior Publication Data

US 2016/0142019 A1     May 19, 2016

(30) Foreign Application Priority Data

Nov. 14, 2014    (JP) ................................. 2014-231510

(51) Int. Cl.
    *H03F 3/45*         (2006.01)
    *H03F 3/217*       (2006.01)

(52) U.S. Cl.
    CPC ....... *H03F 3/2173* (2013.01); *H03F 3/45183* (2013.01); *H03F 3/45771* (2013.01); *H03F 2200/375* (2013.01); *H03F 2203/45044* (2013.01); *H03F 2203/45674* (2013.01)

(58) Field of Classification Search
    CPC ........ H03F 3/45; H03F 3/456; H03F 3/45748; H03F 3/45973

USPC .................................................. 330/258, 259
See application file for complete search history.

(56) References Cited

U.S. PATENT DOCUMENTS 4,308,504 A * 12/1981 Ida ...................... H03F 3/45376
                                              330/253

FOREIGN PATENT DOCUMENTS

JP          S61-23403 A     1/1986

* cited by examiner

*Primary Examiner* — Steven J Mottola
(74) *Attorney, Agent, or Firm* — Rabin & Berdo, P.C.

(57) ABSTRACT

An output voltage delay time caused by the relationship between offset voltage and input voltage is shortened. A single power supply amplifying device includes first and second amplifying units, a state detecting unit, and an offset voltage correcting unit. The first amplifying unit has differential pair transistors and amplifies the difference between input voltages. The second amplifying unit amplifies a first output voltage of the first amplifying unit. The state detecting unit detects a state where a negative offset voltage that causes a second output voltage of the second amplifying unit to be lower than the input voltage occurs, and a potential of the input voltage is lower than the absolute value of the negative offset voltage. The offset voltage correcting unit then corrects the negative offset voltage to a positive offset voltage that causes the second output voltage to be higher than the input voltage.

16 Claims, 13 Drawing Sheets

| | | INPUT VOLTAGE L LEVEL | |
|---|---|---|---|
| | | HIGHER THAN $\|Voffset\|$ | LOWER THAN $\|Voffset\|$ |
| OFFSET VOLTAGE Voffset | POSI-TIVE | SHORT DELAY (STATE A) | SHORT DELAY (STATE B) |
| | NEGA-TIVE | SHORT DELAY (STATE C) | LONG DELAY (STATE D) |

AMPLIFYING DEVICE AND OFFSET VOLTAGE CORRECTION METHOD

CROSS-REFERENCE TO RELATED APPLICATIONS

This application claims priority from application JP 2014-231510, filed in Japan on Nov. 14, 2014, herein incorporated by reference.

BACKGROUND OF THE INVENTION

1. Field of the Invention

The present invention relates to an amplifying device and offset voltage correction method.

2. Description of the Background Art

Offset voltage normally occurs in a differential amplifier circuit, deriving from the characteristics of transistors comprising a differential pair. When the offset voltage is large, the offset voltage may cause error and affect the circuit operation, because of which offset voltage reduction is carried out.

Technology whereby, for example, a sub-load element is connected in parallel with the load element of one or both of a differential amplifier pair, and offset voltage is reduced by the control voltage of the sub-load element being variable, has been proposed as existing technology.

SUMMARY OF THE INVENTION

In a non-ideal existing operational amplifier circuit, there is a delay between input and output voltage from the rise of the input voltage to the rise of the output voltage. However, with the existing operational amplifier circuit, there is a problem in that a state occurs wherein the delay time is longer under certain specific conditions of the relationship between offset voltage and input voltage than under other conditions.

When there is variation in the delay time depending on this kind of difference in conditions, device operation becomes unstable, leading to a reduction in quality and reliability. Also, the problem of the delay time increasing under specific conditions is not ameliorated by technology, including the heretofore described existing technology that attempts simply to reduce offset voltage.

The invention, having been contrived with this kind of problem in mind, has an object of providing an amplifying device and offset voltage adjustment method such that an output voltage delay time caused by the relationship between offset voltage and input voltage is shortened.

In order to resolve the heretofore described problem, an amplifying device that operates on a single power supply is provided. The amplifying device includes a first amplifying unit, a second amplifying unit, a state detecting unit, and an offset voltage correcting unit.

The first amplifying unit has differential pair transistors and amplifies the difference between input voltages. The second amplifying unit amplifies a first output voltage of the first amplifying unit. The state detecting unit, when an offset voltage occurs due to inequality in the current drive capabilities of the differential pair transistors, detects a state wherein a negative offset voltage that causes a second output voltage of the second amplifying unit to be lower than the input voltage occurs, and a low potential level of the input voltage is lower than the absolute value of the negative offset voltage. The offset voltage correcting unit, when the state is detected, carries out correction control for correcting the negative offset voltage to a positive offset voltage that causes the second output voltage to be higher than the input voltage.

An output voltage delay time caused by the relationship between offset voltage and input voltage can be shortened.

BRIEF DESCRIPTION OF THE DRAWINGS

FIG. 4 is a diagram showing a table containing the relationship between lengths of output voltage delay time;

DETAILED DESCRIPTION OF THE INVENTION

Hereafter, a description will be given of embodiments, with reference to the drawings. In the specification and drawings, a redundant description may be omitted by the same reference sign being given to components having essentially the same function.

First Embodiment

Figure 1:
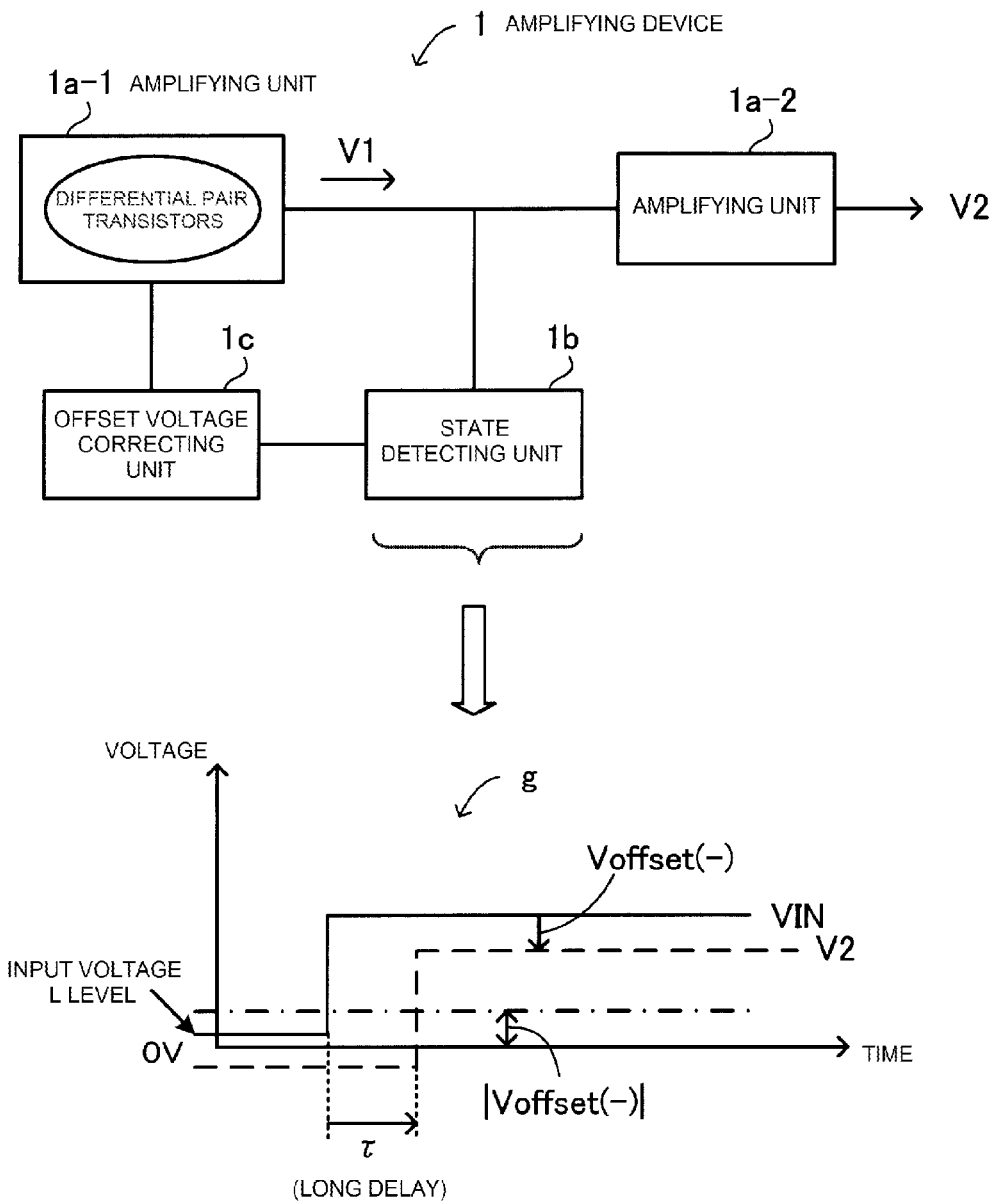
FIG. 1 is a diagram showing an exemplary configuration of an amplifying device.

FIG. 1 is a diagram showing an exemplary configuration of an amplifying device. An amplifying device 1 of a first embodiment is a device that operates on a single power supply (for example, a positive polarity power supply), and includes an amplifying unit 1a-1 (first amplifying unit), an amplifying unit 1a-2 (second amplifying unit), a state detecting unit 1b, and an offset voltage correcting unit 1c.

The amplifying unit 1a-1 has differential pair transistors, and amplifies the difference between input voltages. The amplifying unit 1a-2 amplifies an output voltage V1 (first output voltage) of the amplifying unit 1a-1.

The state detecting unit 1b detects a state such that a delay time becomes longer under certain specific conditions of the relationship between offset voltage and input voltage than under other conditions. A graph g shown in FIG. 1 shows the state detected by the state detecting unit 1b. The vertical axis is voltage, while the horizontal axis is time.

Specifically, the state detecting unit 1b detects a state wherein a negative offset voltage Voffset (−) is generated, and the low potential level (hereafter, L level) of an input voltage VIN of the amplifying unit 1a-1 is lower than the absolute value |Voffset (−)| of the negative offset voltage (|α| is the absolute value of α).

A negative offset voltage is an offset voltage that reduces an output voltage V2 (second output voltage) of the amplifying unit 1a-2 to a voltage lower than the input voltage VIN.

The offset voltage correcting unit 1c carries out correction control for correcting the negative offset voltage Voffset (−) to a positive offset voltage when the relevant state is detected. A positive offset voltage is an offset voltage that increases the output voltage V2 to a voltage higher than the input voltage VIN.

In this way, the amplifying device 1 corrects a negative offset voltage to a positive offset voltage when the kind of state shown in graph g is detected. Therefore, a delay time τ from the rise of the input voltage VIN to the rise of the output voltage V2 can be shortened.

Herein, a description will be given of offset voltage. Offset voltage occurs because of an inequality in the current drive capabilities of transistors forming differential pair transistors. Also, a current (drain current) Id flowing through a transistor in a saturation region is calculated using the following expression.

$$Id = (1/2) \cdot \mu \cdot Cox \cdot (W/L) \cdot (Vgs - Vth)^2 \quad 1$$

μ is the movement of electrons in a semiconductor, Cox is the gate oxide film capacitance per unit area, W/L is the aspect ratio, Vgs is the gate-to-source voltage, and Vth is the threshold voltage. W is the gate width (channel width), and L is the gate length (channel length).

As the expression for calculating transistor current includes multiple parameters, as shown in Expression 1, it can be said that a difference in the currents flowing occurs due to a difference in any parameter, and offset voltage occurs. Note that, of these parameters, a difference in threshold voltage has a particularly large effect on the factors in offset voltage occurring.

Threshold voltage is the gate-to-source voltage at which drain current starts to flow. When the threshold voltages of transistors forming differential pair transistors differ, the currents flowing through the transistors also differ, because of which inequality occurs in the current drive capabilities, and offset voltage occurs.

Problems to be Resolved

Next, before describing the details of the invention, a description will be given, using FIGS. 2 to 8, of problems to be resolved. First, a description will be given of the configuration and operation of a general operational amplifier.

Figure 2:
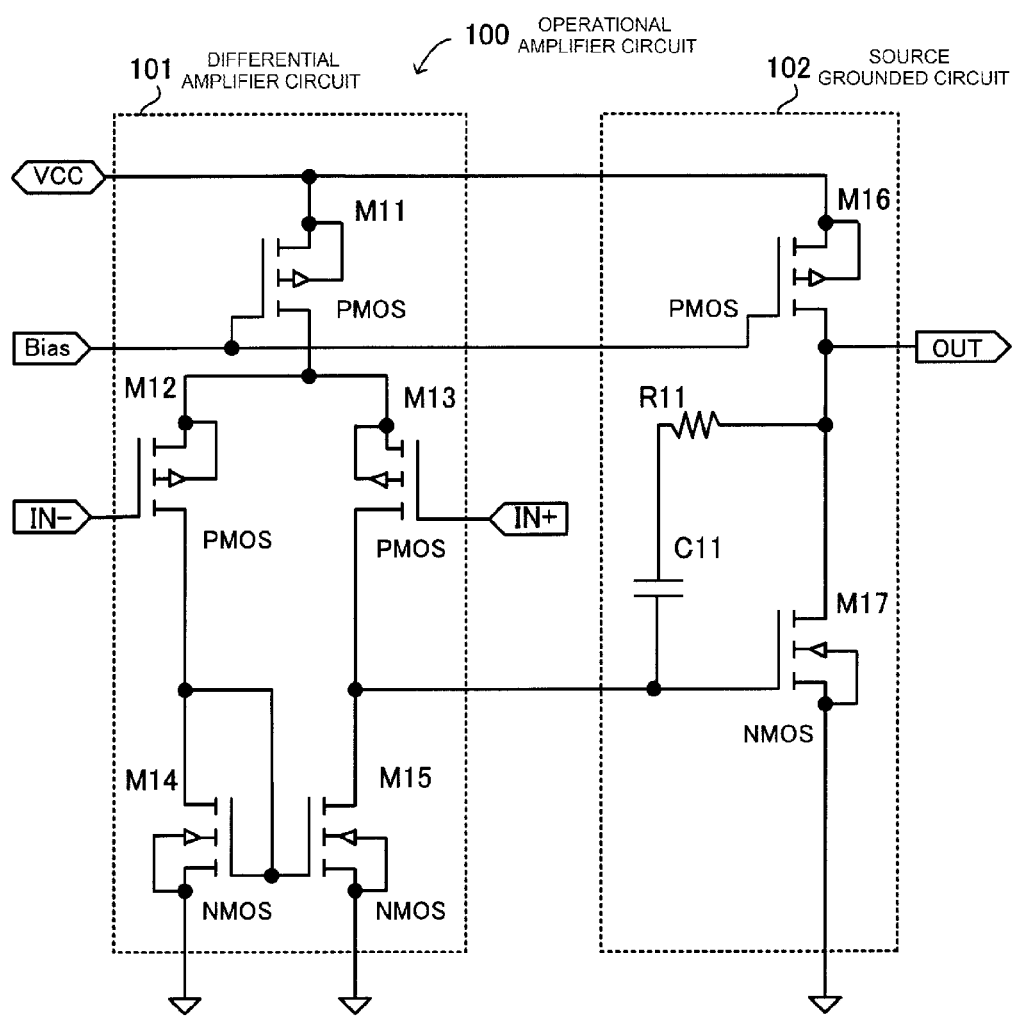
FIG. 2 is a diagram showing an exemplary configuration of an operational amplifier circuit.

FIG. 2 is a diagram showing an exemplary configuration of an operational amplifier circuit. An operational amplifier circuit 100 is of a two-stage (two-stage amplification) circuit configuration including a differential amplifier circuit 101, which forms an input stage, and a source grounded circuit 102, which forms an output stage.

The differential amplifier circuit 101 includes PMOS (P-channel Metal-Oxide Semiconductor) transistors M11 to M13 and NMOS (N-channel MOS) transistors M14 and M15.

Also, the source grounded circuit 102 includes a PMOS transistor M16, an NMOS transistor M17, a resistor R11, and a capacitor C11. The capacitor C11 is a phase compensating capacitor for compensating for a phase differential between the input and output of the operational amplifier circuit 100, thereby restricting feedback loop oscillation.

With regard to connections between terminals and elements, a power supply terminal VCC is connected to the source of the transistor M11 and the source of the transistor M16. A bias terminal Bias is connected to the gate of the transistor M11 and the gate of the transistor M16.

The drain of the transistor M11 is connected to the source of the transistor M12 and the source of the transistor M13. A positive electrode side input terminal IN+ is connected to the gate of the transistor M13, and a negative electrode side input terminal IN− is connected to the gate of the transistor M12.

An output terminal OUT is connected to the drain of the transistor M16, one end of the resistor R11, and the drain of the transistor M17. The other end of the resistor R11 is connected to one end of the capacitor C11, the other end of the capacitor C11 is connected to the drain of the transistor M13, the drain of the transistor M15, and the gate of the transistor M17, and the source of the transistor M17 is connected to GND.

The drain of the transistor M12 is connected to the drain of the transistor M14, the gate of the transistor M14, and the gate of the transistor M15. The source of the transistor M14 is connected to GND, and the source of the transistor M15 is connected to GND.

This kind of operational amplifier circuit 100 can be used as a voltage follower. A voltage follower is a circuit that operates so that input voltage and output voltage are equal. Hereafter, with a voltage follower as an example, a description will be given of operations until the circuit system of the operational amplifier circuit 100 stabilizes.

Figure 3:
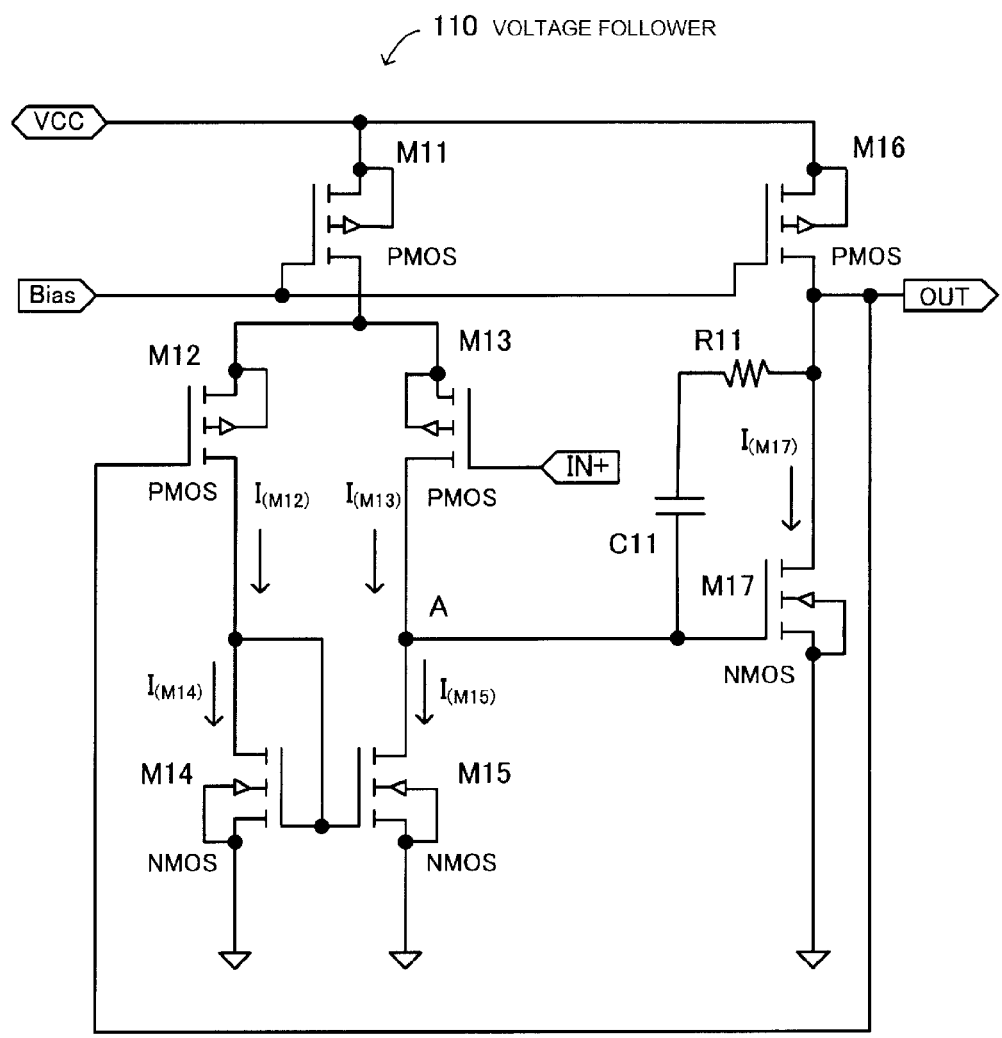
FIG. 3 is a diagram showing an exemplary configuration of a voltage follower.

FIG. 3 is a diagram showing an exemplary configuration of a voltage follower. In a voltage follower 110, points that differ from the configuration of FIG. 2 are that there is no input terminal IN−, and that the gate of the transistor M12 is connected to the output terminal OUT, the drain of the transistor M16, one end of the resistor R11, and the drain of the transistor M17. The other configurations are the same as in FIG. 2.

Herein, consideration will be given to a case wherein voltage output from the output terminal OUT (hereafter, output voltage VOUT) is lower than voltage input to the input terminal IN+(hereafter, input voltage VIN) (VIN>VOUT).

At this time, the gate-to-source voltages of the differential pair PMOS transistors M12 and M13 are such that a gate-to-source voltage $Vgs_{(M12)}$ of the transistor M12 is greater than a gate-to-source voltage $Vgs_{(M13)}$ of the transistor M13, $Vgs_{(M12)} > Vgs_{(M13)}$.

Also, as is also clear from Expression 1, the greater the gate-to-source voltage, the greater the flow of drain current, because of which current $I_{(M12)}$ flowing through the transistor M12 is greater than current $I_{(M13)}$ flowing through the transistor M13 ($I_{(M12)} > I_{(M13)}$).

Meanwhile, as the transistor M14 connected in cascade to the transistor M12 is a transistor in a diode connection (the drain and gate are connected), the current $I_{(M12)}$ flowing through the transistor M12 also flows into the transistor M14.

That is, the current $I_{(M12)}$ flowing through the transistor M12 and current $I_{(M14)}$ flowing through the transistor M14 are equal ($I_{(M12)} = I_{(M14)}$).

Meanwhile, as the gates of the transistors M14 and M15 are of the same potential and the sources of the transistors M14 and M15 are of the same potential, the gate-to-source voltages of both the transistors M14 and M15 are equal, and equal currents flow through the transistors M14 and M15.

That is, the current $I_{(M14)}$ flowing through the transistor M14 and current $I_{(M15)}$ flowing through the transistor M15 are equal ($I_{(M14)}=I_{(M15)}$). To summarize the above, $I_{(M12)}=I_{(M14)}=I_{(M15)}>I_{(M13)}$.

In this case, focusing on node A, the state is such that the current $I_{(M15)}$ flowing out of node A is greater than the current $I_{(M13)}$ flowing into node A. Therefore, the voltage of node A (the gate voltage of the transistor M17) drops.

When the voltage of the node A drops, the voltage applied to the gate of the transistor M17 drops, because of which current $I_{(M17)}$ flowing into the transistor M17 decreases. Meanwhile, transistor M16 operates as a constant current supply.

Owing to the current $I_{(M17)}$ flowing into the transistor M17 decreasing, a node of the output terminal OUT is such that current flowing out is smaller than current flowing in. Therefore, the output voltage VOUT from the output terminal OUT rises.

When the output voltage VOUT rises until the output voltage VOUT and input voltage VIN become equal, the gate-to-source voltages Vgs of the differential pair transistors M12 and M13 become equal.

Further, the current $I_{(M12)}$ flowing into the transistor M12 and current $I_{(M13)}$ flowing into the transistor M13 become equal, the drop in the voltage of node A stops, and the system stabilizes. At this time, (input voltage VIN)=(output voltage VOUT), and the essential function of the voltage follower 110 operates normally.

Heretofore, a description has been given using the voltage follower 110, but as the function of the operational amplifier circuit 100 is the same, feedback is also applied in the operational amplifier circuit 100 so that the voltage of node A stabilizes, that is, so that the current $I_{(M12)}$ flowing into the transistor M12 and current $I_{(M13)}$ flowing into the transistor M13 become equal.

Next, a description will be given of a problem with the operational amplifier circuit 100, taking as an example a case wherein the operational amplifier circuit 100 is caused to operate as a voltage follower, in the same way as heretofore described.

In the voltage follower 110 shown in FIG. 3, due to manufacturing variation and the like, differences occur in the threshold voltages as a characteristic of the differential pair transistors M12 and M13.

State A

This is a case wherein a threshold voltage $Vth_{(M13)}$ of the transistor M13 is greater by $\Delta Vth$ (>0) (V) than a threshold voltage $Vth_{(M12)}$ of the transistor M12, and the input voltage is greater than $\Delta Vth$.

When taking the reference threshold voltage of the transistors M12 and M13 to be Vth0, ($|Vth_{(M13)}|=|Vth0|+|\Delta Vth|$, and $|Vth_{(M12)}|=|Vth0|$). In this case, as is also clear from Expression 1, a larger drain current flows when the threshold voltage is low.

Consequently, $I_{(M12)}>I_{(M13)}$, and as the voltage of node A drops, the output voltage VOUT from the output terminal OUT rises, as heretofore described.

At this time, VOUT=VIN1+$\Delta$Vth when a voltage VIN1 is input to the input terminal IN+, and when the voltage VIN1 is greater than $\Delta$Vth, VOUT=VIN1+$\Delta$Vth (>0).

In this example, a positive offset voltage +$\Delta$Vth occurs. Note that in State A, VOUT>0, because of which feedback is applied normally, the currents flowing into the differential pair transistors M12 and M13 are equal, and the voltage of node A stabilizes.

State B

This is a case wherein the threshold voltage $Vth_{(M13)}$ of the transistor M13 is greater by $\Delta Vth$ (>0) (V) than the threshold voltage $Vth_{(M12)}$ of the transistor M12, and the input voltage is lower than $\Delta Vth$.

In this case, the output voltage VOUT from the output terminal OUT rises. At this time, VOUT=VIN2+$\Delta$Vth when a voltage VIN2 is input to the input terminal IN+, and when the voltage VIN2 is lower than $\Delta$Vth, VOUT=VIN2+$\Delta$Vth (>0).

In the case of State B too, a positive offset voltage +$\Delta$Vth occurs, and as VOUT>0, feedback is applied normally, the currents flowing into the differential pair transistors M12 and M13 are equal, and the voltage of node A is stable.

State C

This is a case wherein the threshold voltage $Vth_{(M12)}$ of the transistor M12 is greater by $\Delta Vth$ (>0) (V) than the threshold voltage $Vth_{(M13)}$ of the transistor M13, and the input voltage is greater than $\Delta Vth$.

When taking the reference threshold voltage of the transistors M12 and M13 to be Vth0, ($|Vth_{(M12)}|=|Vth0|+|\Delta Vth|$, and $|Vth_{(M13)}|=|Vth0|$). In this case, $I_{(M13)}>I_{(M12)}$, and the current flowing into node A is greater than the current flowing out, because of which the voltage of node A increases, and the output voltage VOUT from the output terminal OUT drops.

At this time, VOUT=VIN1−$\Delta$Vth when the voltage VIN1 is input to the input terminal IN+, and when the voltage VIN1 is greater than $\Delta$Vth, VOUT=VIN1−$\Delta$Vth (>0).

In this way, in State C, a negative offset voltage −$\Delta$Vth occurs, but as VOUT>0, feedback is applied normally, the currents flowing into the differential pair transistors M12 and M13 are equal, and the voltage of node A is stable.

State D

This is a case wherein the threshold voltage $Vth_{(M12)}$ of the transistor M12 is greater by $\Delta Vth$ (>0) (V) than the threshold voltage $Vth_{(M13)}$ of the transistor M13, and the input voltage is lower than $\Delta Vth$.

In this case, the output voltage VOUT from the output terminal OUT drops. At this time, VOUT=VIN2−$\Delta$Vth when the voltage VIN2 is input to the input terminal IN+, and when the voltage VIN2 is lower than $\Delta$Vth, VOUT=VIN2−$\Delta$Vth (<0).

Consequently, although VOUT<0, negative voltage cannot be output because the voltage follower 110 is a positive single power supply circuit.

Therefore, feedback does not function normally, a state wherein the currents flowing through the differential pair transistors M12 and M13 are unequal continues, and the current $I_{(M13)}$ flowing through the transistor M13 becomes greater than the current $I_{(M12)}$ flowing through the transistor M12 ($I_{(M13)}>I_{(M12)}$).

Therefore, the current $I_{(M13)}$ flowing through the transistor M13 becomes greater than the current $I_{(M15)}$ flowing through the transistor M15 ($I_{(M13)}>I_{(M15)}$), because of which the current flowing into node A ($I_{(M13)}$) is greater than the current flowing out ($I_{(M15)}$), and the voltage of node A rises as far as the vicinity of the power supply voltage in order that this state is not disturbed.

When this kind of State D exists, the input voltage rises sharply, and when the input voltage becomes higher than $\Delta$Vth, the voltage of node A drops from the power supply voltage level and attempts to return to the original level. At this time, as node A has been charged by the capacitor C11 shown in FIG. 3, time is needed for discharge, and a considerable delay occurs in the rise of the output voltage.

Next, using FIGS. 4 to 8, a description will be given of output voltage delay. FIG. 4 is a diagram showing a table containing the relationship between lengths of output voltage delay time. Table T1 shows the details of States A to D summarized in table form, and includes items "Input Voltage L Level" and "Offset Voltage Voffset".

Furthermore, "Input Voltage L Level" has sub-items "Higher than |Voffset|" and "Lower than |Voffset|", and "Offset Voltage Voffset" has sub-items "Positive" and "Negative".

When the State A offset voltage Voffset is positive and the input voltage L level is higher than the absolute value of the positive offset voltage Voffset, the delay time of the output voltage with respect to the input voltage is short, meaning that the delay is short.

When the State B offset voltage Voffset is positive and the input voltage L level is lower than the absolute value of the positive offset voltage Voffset, the delay time of the output voltage with respect to the input voltage is short, meaning that the delay is short.

When the State C offset voltage Voffset is negative and the input voltage L level is higher than the absolute value of the negative offset voltage Voffset, the delay time of the output voltage with respect to the input voltage is short, meaning that the delay is short.

When the State D offset voltage Voffset is negative and the input voltage L level is lower than the absolute value of the negative offset voltage Voffset, the delay time of the output voltage with respect to the input voltage is long, meaning that the delay is long.

FIGS. 5 to 8 are diagrams showing the delay time of the output voltage with respect to the input voltage. The vertical axis is voltage, while the horizontal axis is time. FIGS. 5 to 8 show States A to D schematically.

Figure 5:
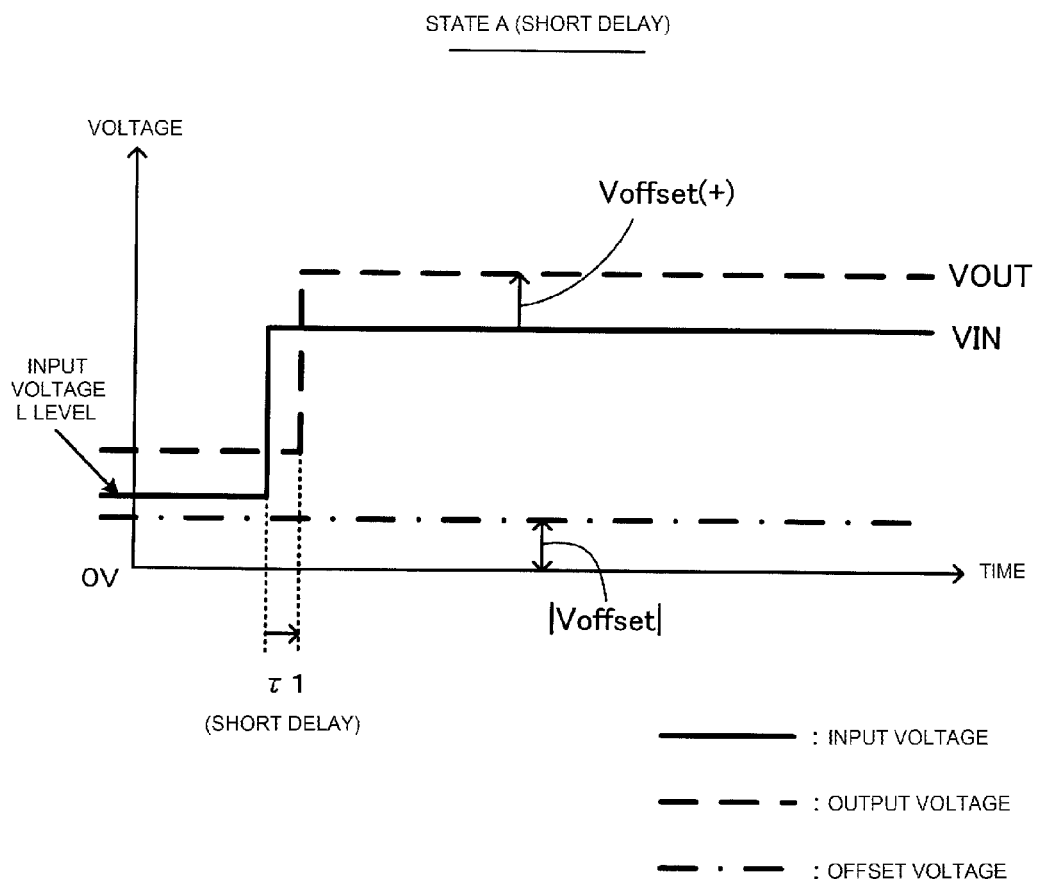
FIG. 5 is a diagram showing the delay time of the output voltage with respect to the input voltage.

FIG. 5 shows the waveforms of the input and output voltages in State A. This is a case wherein the offset voltage Voffset is positive, and the input voltage VIN L level is higher than the absolute value of the offset voltage Voffset. At this time, the output voltage VOUT rises taking a delay time $\tau 1$ with respect to the rise of the input voltage VIN.

Figure 6:
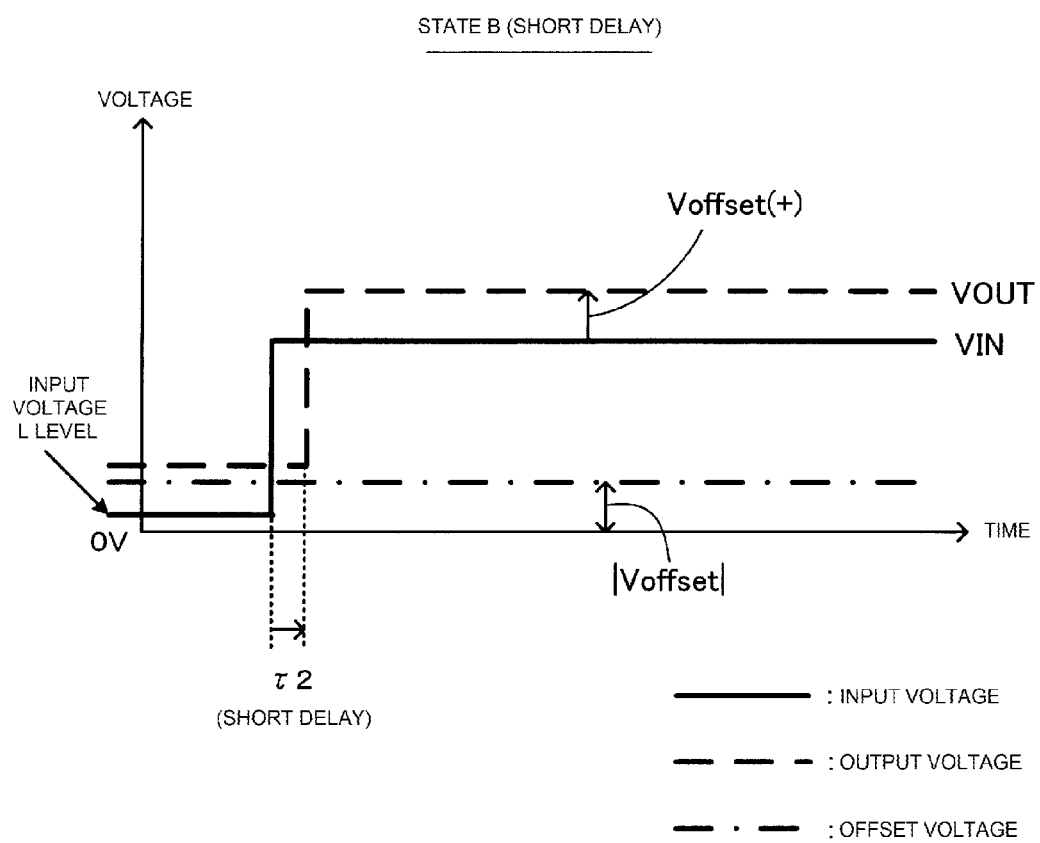
FIG. 6 is a diagram showing the delay time of the output voltage with respect to the input voltage.

FIG. 6 shows the waveforms of the input and output voltages in State B. This is a case wherein the offset voltage Voffset is positive, and the input voltage VIN L level is lower than the absolute value of the offset voltage Voffset. At this time, the output voltage VOUT rises taking a delay time $\tau 2$ with respect to the rise of the input voltage VIN.

Figure 7:
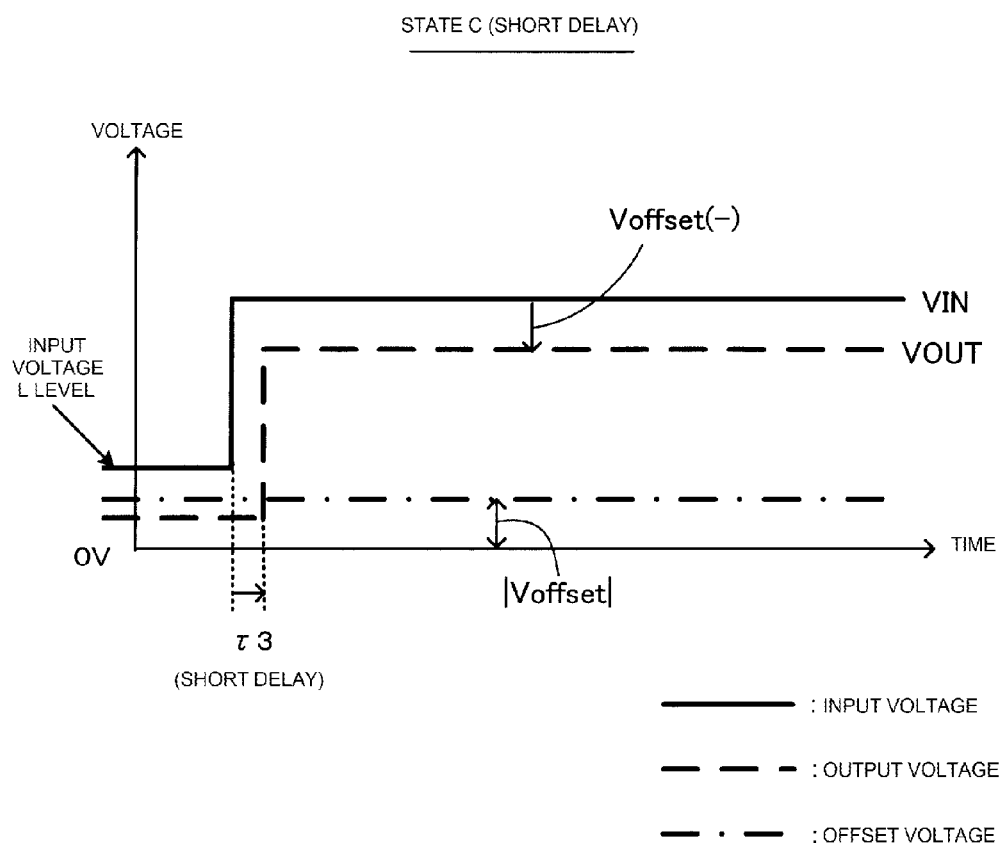
FIG. 7 is a diagram showing the delay time of the output voltage with respect to the input voltage.

FIG. 7 shows the waveforms of the input and output voltages in State C. This is a case wherein the offset voltage Voffset is negative, and the input voltage VIN L level is higher than the absolute value of the offset voltage Voffset. At this time, the output voltage VOUT rises taking a delay time $\tau 3$ with respect to the rise of the input voltage VIN.

Figure 8:
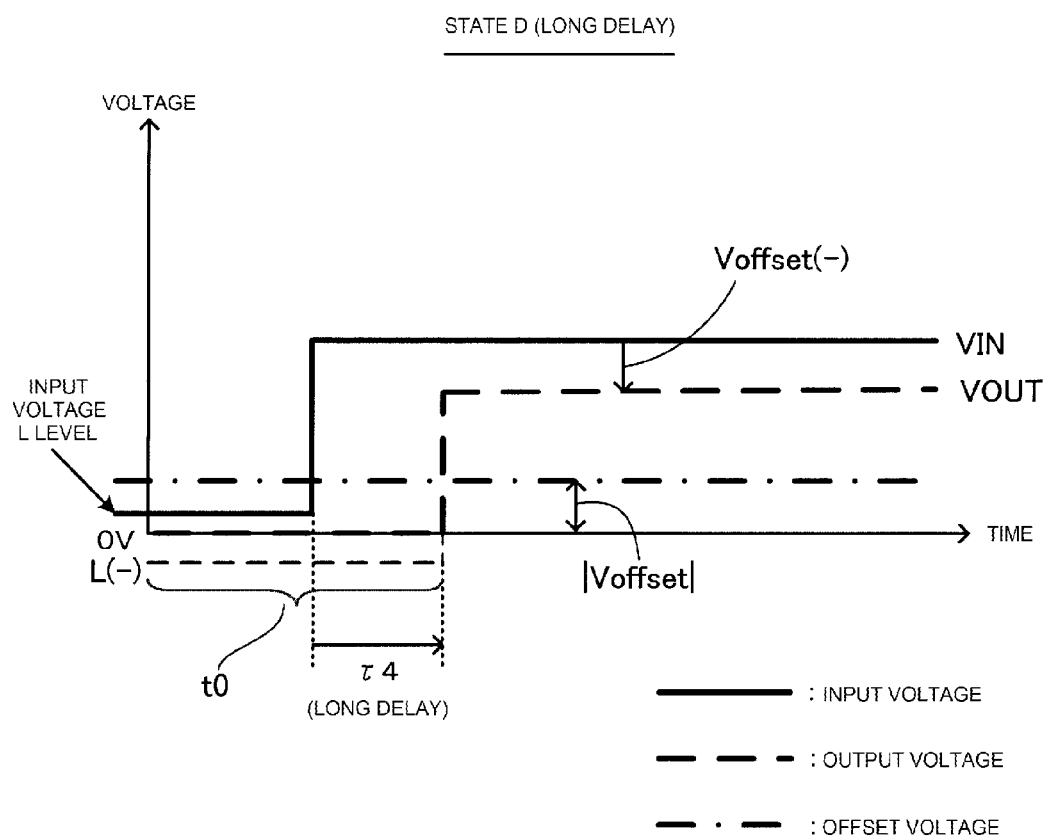
FIG. 8 is a diagram showing the delay time of the output voltage with respect to the input voltage.

FIG. 8 shows the waveforms of the input and output voltages in State D. This is a case wherein the offset voltage Voffset is negative, and the input voltage VIN L level is lower than the absolute value of the offset voltage Voffset. At this time, the output voltage VOUT rises taking a delay time $\tau 4$ with respect to the rise of the input voltage VIN.

By rights, feedback equivalent to the drop in the offset voltage is applied so that the output voltage VOUT falls to a level L(−), but in actuality, as the operation is a single power supply operation, negative voltage cannot be output, and the output for a period t0 is 0V in FIG. 8.

Herein, the delay time $\tau 4$ is the longest delay time of the delay times $\tau 1$ to $\tau 4$. The reason for this is that in State D, as heretofore described, feedback does not function normally, equality of the current flowing into node A and the current flowing out cannot be achieved, and the voltage of node A rises as far as the power supply voltage.

At this time, when the input voltage becomes higher than the offset voltage, the voltage of node A drops from the power supply voltage level and attempts to return to the original level, but as node A has been charged by the capacitor C11, time is needed for discharge, and a considerable delay occurs in the rise of the output voltage.

In this way, with the existing operational amplifier circuit, there is a problem in that the delay time until the output voltage rises is longer under certain specific conditions. When this kind of phenomenon occurs, a disadvantage such as a long delay occurring under certain conditions occurs when the operational amplifier circuit is used in, for example, a device that drives an application wherein high-speed response is necessary, leading to a reduction in quality and reliability.

The invention, having been contrived with this kind of problem in mind, provides an amplifying device and offset voltage correction method that achieve a shortening of an output voltage delay time caused by the relationship between offset voltage and input voltage.

Second Embodiment

Figure 9:
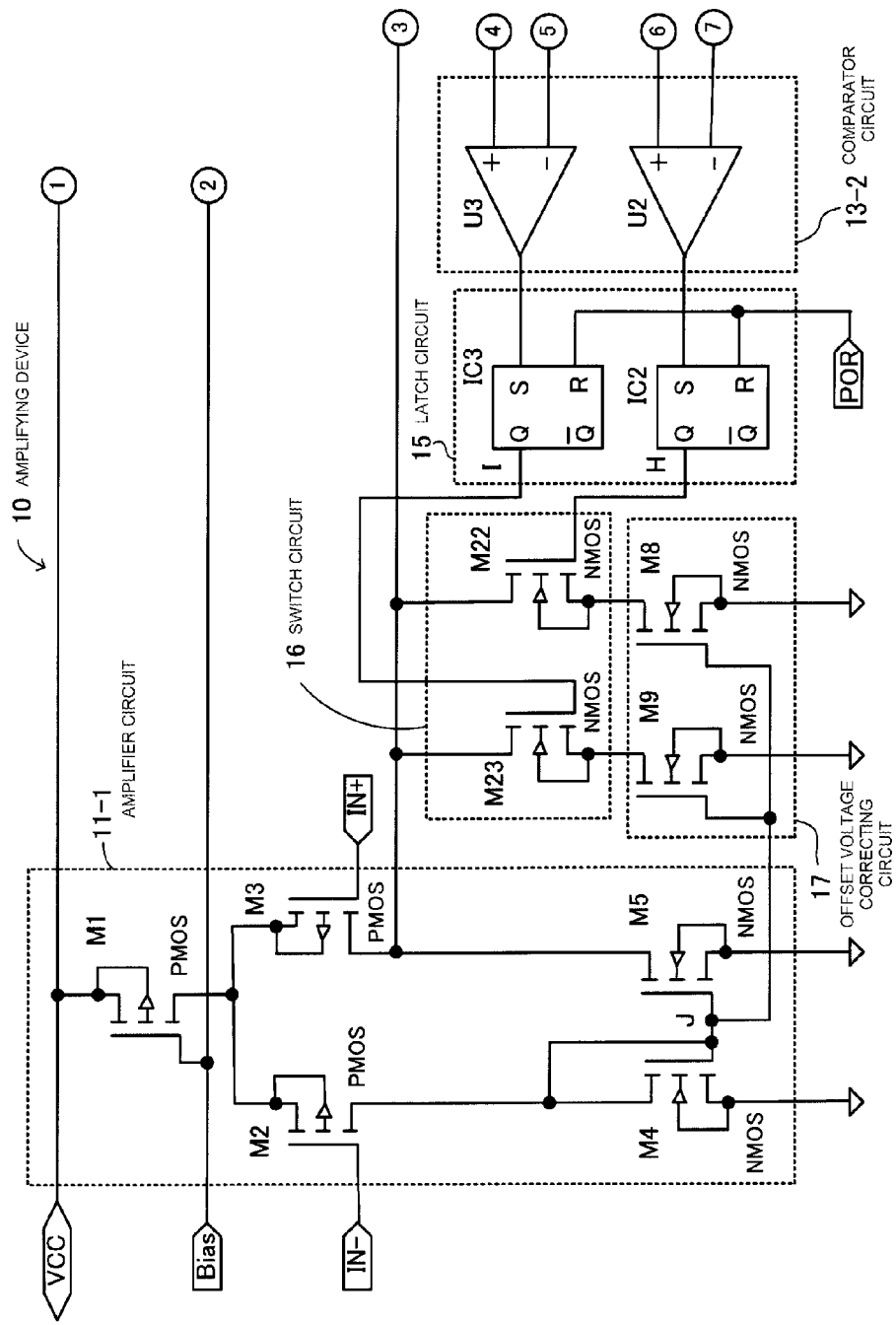
FIG. 9 is a diagram showing an exemplary configuration of an amplifying device.
Figure 10:
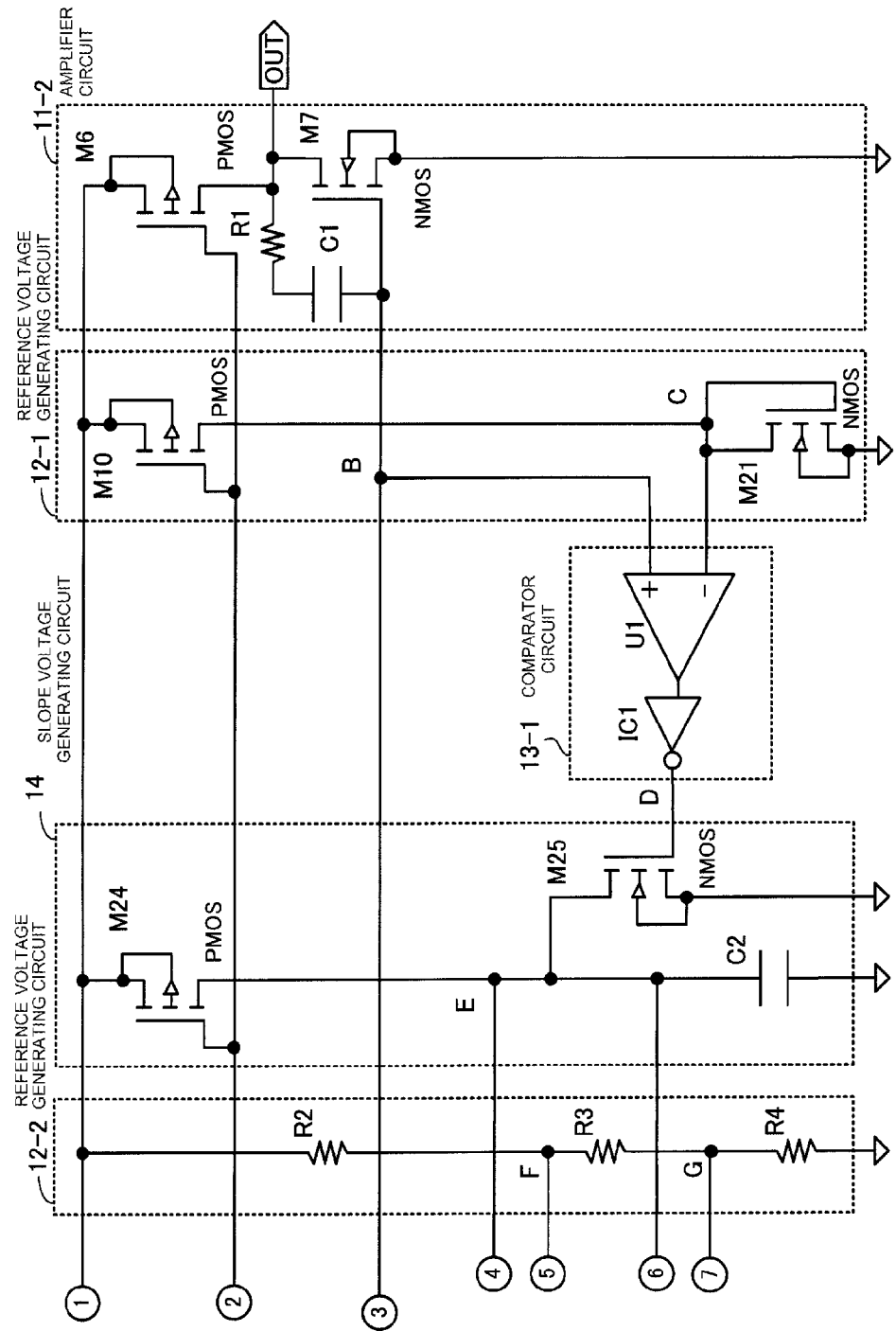
FIG. 10 is a diagram showing an exemplary configuration of an amplifying device.

Next, a detailed description will be given of an amplifying device of the invention. FIGS. 9 and 10 are diagrams showing an exemplary configuration of an amplifying device. An amplifying device 10 of a second embodiment includes amplifier circuits 11-1 and 11-2, reference voltage generator circuits 12-1 and 12-2, comparator circuits 13-1 and 13-2, a slope voltage generator circuit 14, a latch circuit 15, a switch circuit 16, and an offset voltage correcting circuit 17.

Correspondence relationships with the components of FIG. 1 are such that the amplifying unit 1a-1 corresponds to the function of the amplifier circuit 11-1, and the amplifying unit 1a-2 corresponds to the function of the amplifier circuit 11-2. Also, the state detecting unit 1b corresponds to the functions of the reference voltage generator circuits 12-1 and 12-2, comparator circuits 13-1 and 13-2, slope voltage generator circuit 14, and latch circuit 15. Furthermore, the offset voltage correcting unit 1c corresponds to the functions of the switch circuit 16 and offset voltage correcting circuit 17.

Meanwhile, the reference voltage generator circuit 12-1 and comparator circuit 13-1 correspond to a comparison unit, while the slope voltage generator circuit 14, reference voltage generator circuit 12-2, comparator circuit 13-2, and latch circuit 15 correspond to a switching control unit. Furthermore, the comparator circuit 13-2 and latch circuit 15 correspond to a switch drive unit.

The amplifier circuit 11-1 includes differential pair PMOS transistors M2 and M3, a current supply PMOS transistor M1, and NMOS transistors M4 and M5, which are active loads, and amplifies the difference in voltage between two input signals input from the input terminals IN+ and IN−.

The amplifier circuit 11-2 includes a PMOS transistor M6, an NMOS transistor M7, a phase compensating capacitor C1, and a resistor R1, and amplifies the output voltage of the amplifier circuit 11-1.

The reference voltage generator circuit 12-1 includes a PMOS transistor M10 and an NMOS transistor M21, and outputs a reference voltage value higher than the input voltage of the amplifier circuit 11-2 at a time of normal operation.

The comparator circuit 13-1 includes a comparator U1 and an inverter IC1, and compares the input voltage of the amplifier circuit 11-2 and the reference voltage output by the reference voltage generator circuit 12-1. Further, the comparator circuit 13-1 outputs the L level when the input voltage of the amplifier circuit 11-2 is higher than the reference voltage, and outputs a high potential level (hereafter, H level) incases other than this.

The slope voltage generator circuit 14 includes a PMOS transistor M24, an NMOS transistor M25, and a capacitor C2. The slope voltage generator circuit 14, with an output signal of the comparator circuit 13-1 as an input, outputs 0 (V) when the output voltage of the comparator circuit 13-1 is at the H level, and generates a slope voltage such that the voltage gradually rises from 0 (V) along with time when the output voltage of the comparator circuit 13-1 is at the L level.

The reference voltage generator circuit 12-2 includes resistors R2, R3, and R4, and generates a reference voltage obtained by resistive division of the power supply voltage.

The comparator circuit 13-2 includes comparators U2 and U3, and compares the slope voltage output from the slope voltage generator circuit 14 and the reference voltage output by the reference voltage generator circuit 12-2. Further, the comparator circuit 13-2 outputs the H level when the slope voltage is higher than the reference voltage, and outputs the L level in cases other than this.

The latch circuit 15 includes SR flip-flops IC2 and IC3, and latches (holds) the output of the comparator circuit 13-2.

The switch circuit 16 includes NMOS transistors M22 and M23, which are switches, and is turned on when the output of the latch circuit 15 is at the H level, becoming conductive.

The offset voltage correcting circuit 17 includes NMOS transistors M8 and M9, which are load elements, is connected to the GND side of the switch circuit 16, and works so as to shift the offset voltage of the amplifier circuit 11-1 to the positive side when the switch circuit 16 is turned on, thereby correcting the offset voltage.

Next, a description will be given of the connection configuration of each element of the amplifying device 10. The power supply terminal VCC is connected to the source of the transistor M1, one end of the resistor R2, the source of the transistor M24, the source of the transistor M10, and the source of the transistor M6.

The bias terminal Bias is connected to the gate of the transistor M1, the gate of the transistor M24, the gate of the transistor M10, and the gate of the transistor M6.

The input terminal IN+ is connected to the gate of the transistor M3, the input terminal IN− is connected to the gate of the transistor M2, and the drain of the transistor M1 is connected to the sources of the transistors M2 and M3.

The drain of the transistor M2 is connected to the drain of the transistor M4, the gate of the transistor M4, the gate of the transistor M5, the gate of the transistor M8, and the gate of the transistor M9. The sources of the transistors M4 and M5 are connected to GND.

The drain of the transistor M3 is connected to the drain of the transistor M5, the drain of the transistor M22, the drain of the transistor M23, an input terminal (+) of the comparator U1, one end of the capacitor C1, and the gate of the transistor M7.

The gate of the transistor M22 is connected to a non-inverting output terminal (Q) of the SR flip-flop IC2, and the gate of the transistor M23 is connected to a non-inverting output terminal (Q) of the SR flip-flop IC3.

The source of the transistor M22 is connected to the drain of the transistor M8, the source of the transistor M23 connected to the drain of the transistor M9, and the sources of the transistors M8 and M9 are connected to GND.

A set input terminal (S) of the SR flip-flop IC2 is connected to an output terminal of the comparator U2, and a set input terminal (S) of the SR flip-flop IC3 is connected to an output terminal of the comparator U3. Reset input terminals (R) of the SR flip-flops IC2 and IC3 are connected to a reset terminal POR (Power On Reset).

Input terminals (+) of the comparators U2 and U3 are connected to the drain of the transistor M24, the drain of the transistor M25, and one end of the capacitor C2, and the other end of the capacitor C2 is connected to GND.

An input terminal (−) of the comparator U2 is connected to one end of the resistor R3 and one end of the resistor R4, an input terminal (−) of the comparator U3 is connected to the other end of the resistor R2 and the other end of the resistor R3, and the other end of the resistor R4 is connected to GND.

The gate of the transistor M25 is connected to an output terminal of the inverter IC1, and the source of the transistor M25 is connected to GND. An input terminal of the inverter IC1 is connected to an output terminal of the comparator U1.

An input terminal (−) of the comparator U1 is connected to the drain of the transistor M10, the drain of the transistor M21, and the gate of the transistor M21, and the source of the transistor M21 is connected to GND.

The output terminal OUT is connected to the drain of the transistor M6, the drain of the transistor M7, and one end of the resistor R1, and the other end of the resistor R1 is connected to the other end of the capacitor C1. The source of the transistor M7 is connected to GND.

Next, a description will be given of a whole operation. At a time of State D wherein, as heretofore described, a negative offset voltage occurs and the input voltage L level is lower than the absolute value of the negative offset voltage, the voltage of a node B (the gate voltage of the transistor M7) rises to near the power supply voltage.

The invention, utilizing this phenomenon, is such that an increase in the delay time occurring in the case of State D is restricted, thereby shortening the delay time, by the negative offset voltage being automatically corrected so as to become a positive offset voltage when in State D.

In this case, firstly, one or multiple load elements as would cause the current drive capability of an active load to increase are connected to the active load on one side of the differential pair transistors. In the example of FIG. 9, the transistors M22 and M23 in the switch circuit 16 are connected in parallel to the transistor M5, which is an active load connected to the differential pair transistor M3.

Further, in order to increase the current drive capability of the transistor M5, the two transistors M8 and M9 are connected to the transistors M22 and M23 in the switch circuit 16.

Herein, when in State D (a negative offset voltage occurs and the input voltage L level is lower than the absolute value of the negative offset voltage), the voltage of node B rises. In this case, when the voltage of node B exceeds the reference voltage of a node C, control is carried out, with this as a trigger, so that the transistors M8 and M9, which are load elements that cause the current drive capability of the active load connected to the transistor M3 to increase, are turned on one by one.

The current drive capability of the active load connected to the transistor M3 increases, and at the point at which the negative offset voltage becomes a positive offset voltage, the voltage of node B returns to a normal value, because of which the increase in the current drive capability of the active load connected to the transistor M3 also stops.

Also, as a signal for causing the current drive capability of the active load connected to the transistor M3 to increase is latched by the latch circuit 15, a normal state is maintained for the period for which the power supply voltage is applied.

In this way, provided that State D is entered even once, offset voltage correction control is triggered, and the negative offset voltage is corrected to a positive offset voltage. Correcting offset voltage from negative to positive entails causing the voltage of node B to drop, thereby preventing the voltage of node B from rising as far as the power supply voltage. Therefore, the amount of charging by the capacitor is also reduced, and the discharge time is shortened, because of which the delay time can be shortened.

Figure 11:
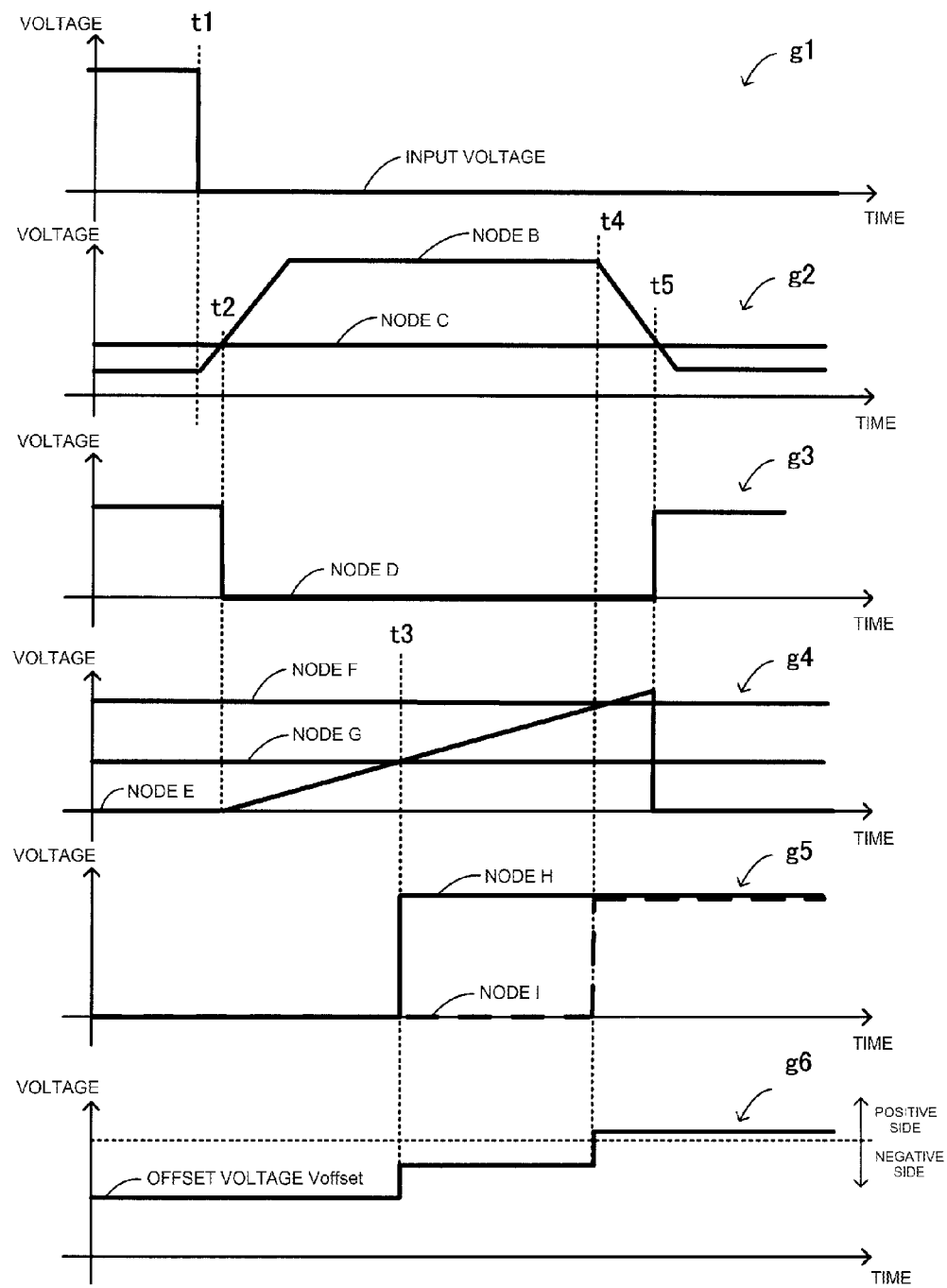
FIG. 11 is a timing chart showing an operation of the amplifying device.

Next, a more detailed description will be given of the operation, referring also to a timing chart. FIG. 11 is a timing chart showing the operation of the amplifying device. The vertical axis is voltage, while the horizontal axis is time. FIG. 11 shows the temporal change of the input voltage, the offset voltage, and the voltages of nodes B to I shown in FIGS. 9 and 10.

A graph g1 shows the waveform of the input voltage, while a graph g2 shows the voltage waveforms of nodes B and C. A graph g3 shows the voltage waveform of node D, while a graph g4 shows the voltage waveforms of nodes E, F, and G. Furthermore, a graph g5 shows the voltage waveforms of nodes H and I, while a graph g6 shows the waveform of the offset voltage Voffset.

1. Firstly, it is assumed that the amplifying device 10 has entered State D, wherein a negative offset voltage occurs and the input voltage L level is lower than the absolute value of the negative offset voltage. For example, it is assumed that the input voltage becomes 0 (V) when a negative offset voltage occurs (time t1). At this time, the voltage of node B begins to rise to the power supply voltage level (time t1).

Node B is a connection point of the gate of the transistor M7, which configures a source-to-ground circuit of the amplifier circuit 11-2, and one end of the capacitor C1, and an occurrence of State D is detected based on the extent of a rise in the voltage applied to node B.

2. The voltage of node B is applied to the input terminal (+) of the comparator U1 in the comparator circuit 13-1, and the voltage of node C is applied to the input terminal (−) of the comparator U1. The voltage of node C (a predetermined voltage value) forms a reference voltage for comparison in the comparator U1, and is set to be a voltage slightly higher than the voltage of node B.

In order to set the voltage of node C higher than the voltage of node B, it is sufficient that the transistors M6 and M10 are of the same size, and that the current drive capability of the transistor M21 is smaller than the current drive capability of the transistor M7.

For example, when the aspect ratio of the transistor M21 is smaller than that of the transistor M7, the current drive capability of the transistor M21 becomes smaller than the current drive capability of the transistor M7.

3. When State D is entered, and the voltage of node B rises to a voltage higher than the voltage of node C (time t2), the comparator U1 outputs the H level, and the voltage of node D, which is the output of the comparator circuit 13-1, switches to the L level (detection signal) (time t2).

4. Upon the voltage of node D switching to the L level, the slope voltage generator circuit 14 starts up. As an operation of the slope voltage generator circuit 14, firstly, the transistor M25 in the slope voltage generator circuit 14 is turned off when the output of the comparator circuit 13-1 switches to the L level.

Also, as the transistor M24 in the slope voltage generator circuit 14 operates as a constant current supply, current flows into the capacitor C2 in the slope voltage generator circuit 14, and a charge begins to accumulate, upon the transistor M25 being turned off. Consequently, the voltage of node E, which is the output of the slope voltage generator circuit 14, begins to rise at a constant gradient (time t2).

The slope voltage is a voltage that is output at 0 volts when the input voltage is at the H level, and rises gradually from 0 volts together with the elapsing of time when the input voltage is at the L level.

5. The slope voltage of node E is applied to the input terminal (+) of the comparator U2 in the comparator circuit 13-2, and the voltage of node G (a first reference voltage) is applied to the input terminal (−) of the comparator U2.

The voltage of node G is a reference voltage for comparison in the comparator U2, and is a constant voltage obtained by division of the power supply voltage by the resistance of the resistors R2, R3, and R4. Taking the power supply voltage to be Vcc and the output voltage of node G to be Vg, Vg=(R4·Vcc)/(R2+R3+R4).

6. Herein, as a first switching control, the comparator U2 in the comparator circuit 13-2 outputs the H level (predetermined level signal) when the slope voltage of node E rises to a voltage higher than the voltage of node G (time t3).

7. The output of the comparator U2 is connected to the set terminal (S) of the SR flip-flop IC2 in the latch circuit 15. Consequently, when the H level is input to the set terminal (S) of the SR flip-flop IC2, the H level is set, and an H level signal is output latched from the non-inverting output terminal (Q).

That is, upon the voltage of node E exceeding the reference voltage of node G, the voltage of node H switches to the H level (time t3).

As the power-on reset terminal (POR) is connected to the reset terminal (R) of the SR flip-flop IC2, the SR flip-flop IC2 is power-on reset when the power is turned on or when manual operation is carried out, and the initial state is reset.

8. Upon node H switching to the H level, the transistor M22 in the switch circuit 16 is turned on.

9. Upon the transistor M22 being turned on, current that has been flowing from the transistor M3 to the transistor M5 also flows into the transistor M8 (a first load element) via the transistor M22. Consequently, in addition to the transistor M5, the transistor M8 becomes an active element connected to the differential pair transistor M3, whereby the current drive capability of the active load connected to the transistor M3 increases.

10. Upon the active elements connected to the transistor M3 increasing and the GND side current drive capability of the transistor M3 increasing, the amount of current flowing from the source to the drain of the PMOS transistor M3 increases, and the drain voltage of the transistor M3 drops (or, as the current drive capability of the active load connected to the transistor M3 increases, the drain voltage of the transistor M5 drops).

As the drain voltage of the transistor M3 is the voltage of node B, the voltage of node B falls, and the output voltage VOUT begins to rise, because of which the offset voltage is corrected to the positive side (time t3).

11. It is assumed that the offset voltage does not become positive even when the first stage transistor M8 in the offset voltage correcting circuit 17 starts up. In this case, the slope voltage of node E, which is the output of the slope voltage generator circuit 14, continues to rise.

12. The slope voltage of node E is applied to the input terminal (+) of the comparator U3 in the comparator circuit 13-2, and the voltage of node F (a second reference voltage) is applied to the input terminal (−) of the comparator U3.

The voltage of node F is a reference voltage for comparison in the comparator U3, and is a constant voltage obtained by division of the power supply voltage by the resistance of the resistors R2, R3, and R4. Taking the output voltage of node F to be Vf, Vf=((R3+R4)·Vcc)/(R2+R3+R4) (Vf>Vg).

13. Herein, as a second switching control, the comparator U3 in the comparator circuit 13-2 outputs the H level (predetermined level signal) when the slope voltage of node E rises to a voltage higher than the voltage of node F (time t4).

14. The output of the comparator U3 is connected to the set terminal (S) of the SR flip-flop IC3 in the latch circuit 15. Consequently, when the H level is input to the set terminal (S) of the SR flip-flop IC3, the H level is set, and an H level signal is output latched from the non-inverting output terminal (Q).

That is, upon the slope voltage of node E exceeding the reference voltage of node F, the voltage of node I switches to the H level (time t4).

The SR flip-flop IC3 too is power-on reset when the power is turned on or when manual operation is carried out, and the initial state is reset.

15. Upon node I switching to the H level, the transistor M23 in the switch circuit 16 is turned on.

16. Upon the transistor M23 being turned on, current that has been flowing from the transistor M3 to the transistors M5 and M8 also flows into the transistor M9 (a second load element) via the transistor M23.

Consequently, in addition to the transistors M5 and M8, the transistor M9 becomes an active element connected to the differential pair transistor M3, whereby the current drive capability of the active load connected to the transistor M3 increases.

17. Upon the active elements connected to the transistor M3 further increasing and the GND side current drive capability of the transistor M3 further increasing, the drain voltage of the PMOS transistor M3 drops further. As the drain voltage of the transistor M3 is the voltage of node B, the voltage of node B falls, the output voltage VOUT rises further, and the offset voltage is corrected so as to rise to the positive side (time t4).

18. At the point at which the offset voltage becomes positive, the rising voltage of node B begins to fall, beginning to return to the normal state (time t4).

19. Upon the voltage of node B reaching the normal state, the voltage of node C becomes higher than the voltage of node B (time t5). Consequently, the voltage of node D, which is the output of the comparator circuit 13-1, switches to the H level, thereby stopping the operation of the slope voltage generator circuit 14.

That is, as the transistor M25 in the slope voltage generator circuit 14 is turned on, current flowing through the transistor M24 flows to the transistor M25 side, the charge accumulated in the capacitor C2 dissipates, and the voltage of node E falls (time t5).

As heretofore described, according to the amplifying device 10, the configuration is such that, when detecting a state wherein a negative offset voltage occurs and the input voltage L level is lower than the absolute value of the negative offset voltage, the negative offset voltage is corrected to a positive offset voltage.

Therefore, an output voltage delay time caused by the relationship between the offset voltage and input voltage can be shortened. Also, as the occurrence of a phenomenon whereby the delay time increases only in a specific state can be eliminated, delay time variation can also be restricted, and quality and reliability can thus be improved.

Also, as heretofore described, the amplifying device 10 is such that a negative offset voltage is shifted to a positive offset voltage by being gradually raised. In the heretofore described example, offset voltage correction is configured of two stages, but in general, offset voltage correction can be configured of N stages (N=1, 2, 3, 4, and so on). Although N may be 1, N is preferably 2 or more. The reason for gradually raising a negative offset voltage is that the offset voltage may differ from article to article due to manufacturing variation or the like.

By offset voltage correction being configured of multiple stages, control can be carried out in a fine step range, because of which correction from a negative offset voltage to a positive offset voltage can be carried out minutely and accurately. Therefore, even when offset voltage varies from article to article due to manufacturing variation or the like, variation from article to article of corrected positive offset voltage can be reduced.

Further still, correction to a positive offset voltage may be carried out by gradually raising the negative offset voltage after setting in advance so that a negative offset voltage is output from the amplifying device 10. By so doing, variation from article to article of offset voltage can be further reduced.

As a method of setting in advance so that a negative offset voltage is output, there is a method whereby, for example, the M4 gate width W/gate length L is configured to be greater than the M5 gate width W/gate length L.

Third Embodiment

Next, a description will be given of a third embodiment. In the third embodiment, the switching control unit as far as the switch circuit 16 being driven by the output of the comparator circuit 13-1, which is one portion of the amplifying device 10, is replaced by a digital switching drive circuit.

Figure 12:
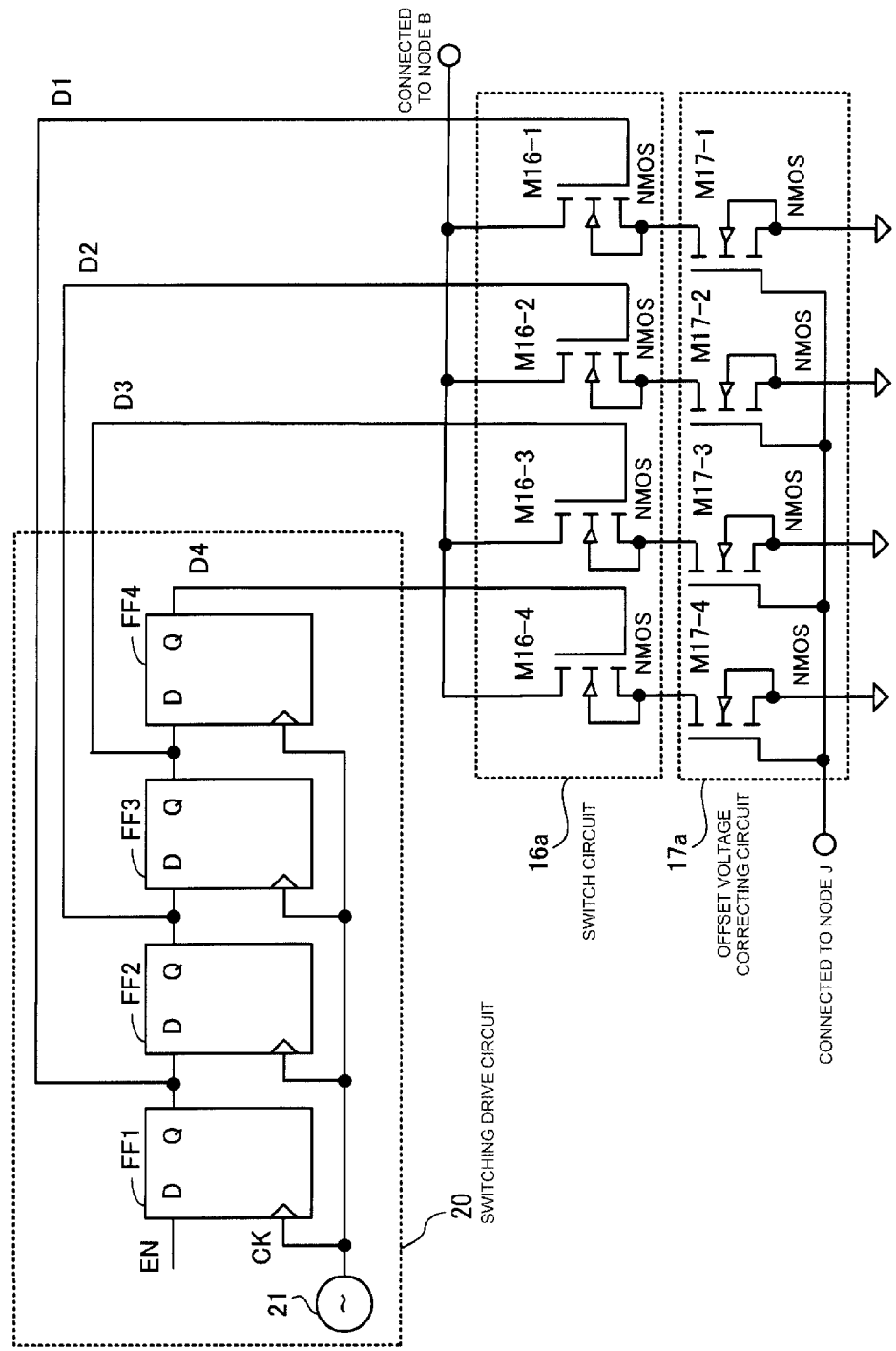
FIG. 12 is a diagram showing an exemplary configuration of a switching drive circuit.

FIG. 12 is a diagram showing an exemplary configuration of a switching drive circuit. In the example of FIG. 12, offset voltage correction is shown configured of four stages. A switching drive circuit 20 includes flip-flops FF1 to FF4 configuring a shift register, and an oscillator 21.

Also, a switch circuit 16a includes NMOS transistors M16-1 to M16-4, and an offset voltage correcting circuit 17a includes NMOS transistors M17-1 to M17-4.

To describe the connection relationships, the output of the oscillator 21 is connected to clock terminals of the flip-flops FF1 to FF4. A signal that is the inverted output of the comparator circuit 13-1 of FIG. 10 (the output of the inverter IC1) is connected to an input terminal (D) of the flip-flop FF1.

An output terminal (Q) of the flip-flop FF1 is connected to an input terminal (D) of the flip-flop FF2 and the gate of the transistor M16-1. An output terminal (Q) of the flip-flop FF2 is connected to an input terminal (D) of the flip-flop FF3 and the gate of the transistor M16-2.

An output terminal (Q) of the flip-flop FF3 is connected to an input terminal (D) of the flip-flop FF4 and the gate of the transistor M16-3. An output terminal (Q) of the flip-flop FF4 is connected to the gate of the transistor M16-4.

The drain of each of the transistors M16-1 to M16-4 is connected to node B of FIG. 10. The source of the transistor M16-1 is connected to the drain of the transistor M17-1, and the source of the transistor M16-2 is connected to the drain of the transistor M17-2.

The source of the transistor M16-3 is connected to the drain of the transistor M17-3, and the source of the transistor M16-4 is connected to the drain of the transistor M17-4. The gate of each of the transistors M17-1 to M17-4 is connected to a node J of FIG. 9, and the source of each of the transistors M17-1 to M17-4 is connected to GND.

Figure 13:
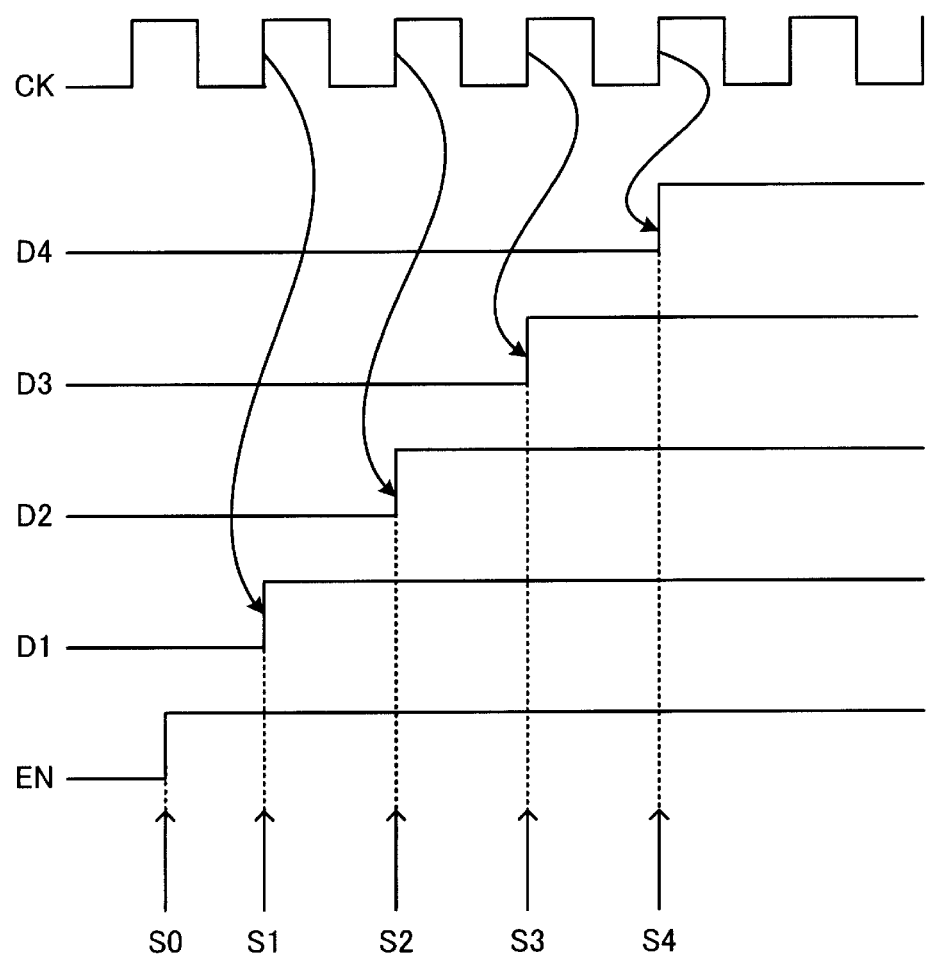
FIG. 13 is a timing chart showing an operation of the switching drive circuit.

FIG. 13 is a timing chart showing an operation of the switching drive circuit. A clock CK is an output signal of the oscillator 21. Signals D1 to D4 (level shifting signals) are output signals of the flip-flops FF1 to FF4 respectively. An enable signal EN is an output signal of the comparator circuit 13-1:

S0: in a state (D) wherein the offset voltage is negative and the input voltage L level is lower than the absolute value of the negative offset voltage, the enable signal EN switches to the H level.

S1: Upon the clock CK rising, the flip-flop FF1 latches the H level enable signal EN, and outputs the signal D1 at the H level. As the signal D1 is at the H level, the transistor M16-1 in the switch circuit 16a is turned on.

Therefore, the drain current of the transistor M3 of FIG. 9 flows into the transistor M17-1 in the offset voltage correcting circuit 17a in addition to the transistor M5 of FIG. 9. Therefore, as heretofore described, the voltage of node B begins to fall, because of which the offset voltage is corrected so as to rise to the positive side.

S2: Upon the clock CK rising, the flip-flop FF2 latches the H level output signal D1 from the flip-flop FF1, and outputs the signal D2 at the H level. As the signal D2 is at the H level, the transistor M16-2 in the switch circuit 16a is turned on.

Therefore, the drain current of the transistor M3 of FIG. 9 flows into the transistor M17-2 in the offset voltage correcting circuit 17a in addition to the transistor M5 of FIG. 9 and the transistor M17-1 in the offset voltage correcting circuit 17a. Therefore, as heretofore described, the voltage of node B begins to fall further, because of which the correction to the positive side of the offset voltage proceeds further from the state of step S1.

S3: Upon the clock CK rising, the flip-flop FF3 latches the H level output signal D2 from the flip-flop FF2, and outputs the signal D3 at the H level. As the signal D3 is at the H level, the transistor M16-3 in the switch circuit 16a is turned on.

Therefore, the drain current of the transistor M3 of FIG. 9 flows into the transistor M17-3 in the offset voltage correcting circuit 17a in addition to the transistor M5 of FIG. 9 and the transistors M17-1 and M17-2 in the offset voltage correcting circuit 17a. Therefore, the correction to the positive side of the offset voltage proceeds further from the state of step S2.

S4: Upon the clock CK rising, the flip-flop FF4 latches the H level output signal D3 from the flip-flop FF3, and outputs the signal D4 at the H level. As the signal D4 is at the H level, the transistor M16-4 in the switch circuit 16a is turned on.

Therefore, the drain current of the transistor M3 of FIG. 9 flows into the transistor M17-4 in the offset voltage correcting circuit 17a in addition to the transistor M5 of FIG. 9 and the transistors M17-1 to M17-3 in the offset voltage correcting circuit 17a. Therefore, the correction to the positive side of the offset voltage proceeds further from the state of step S3.

Simultaneously with the offset voltage becoming positive and the enable signal EN switching to L, the operation of the clock CK is stopped (fixed at L).

In this way, one portion of the amplifying device 10 can also be configured using a digital circuit. An example has been given wherein the switching drive circuit 20 is configured of a shift register, but the switching drive circuit 20 may also be configured of a counter, or a programmable logic device (PLD) or the like can be utilized.

The embodiments have been given as examples, but the configuration of each portion shown in the embodiments can be replaced by another configuration having the same function. Also, other arbitrary components or processes may be added.

What is claimed is:

1. An amplifying device comprising:
    a first amplifying unit having a differential pair of transistors each with a control electrode, the first amplifying unit amplifying a difference between voltages at the control electrodes of the respective transistors, and outputting a first output voltage of the first amplifying unit;
    a second amplifying unit that amplifies the first output voltage of the first amplifying unit and outputs a second output voltage of the second amplifying unit;
    a state detecting unit that detects a state wherein the second output voltage of the second amplifying unit is lower than an input voltage of the amplifying device by a voltage difference defined as a negative offset voltage, the input voltage having a lower potential than an absolute value of the negative offset voltage; and
    an offset voltage correcting unit that, when the state is detected, corrects the negative offset voltage to a positive offset voltage, defined as a positive voltage difference of the second output voltage relative to the input voltage, wherein the second output voltage of the second amplifying unit has a higher potential than the input voltage of the amplifying device.

2. The amplifying device according to claim 1, wherein:
    the second amplifying unit includes a transistor with a grounded source and a capacitor, and a node to which the gate of the transistor with the grounded source and the capacitor are connected,
    the first output voltage of the first amplifying unit is applied to the node,
    the state detecting unit detects an occurrence of the state based on the extent of a rise in the first output voltage of the first amplifying unit.

3. The amplifying device according to claim 1, wherein the offset voltage correcting unit corrects the negative offset voltage to the positive offset voltage by gradually raising the negative offset voltage.

4. The amplifying device according to claim 2, wherein the offset voltage correcting unit includes:
    a plurality of switches, connected in parallel to one of the transistors of the differential pair, that allow or shut off the flow of current output from the transistor; and
    a plurality of load elements, corresponding to each to the switches, that cause the current to flow via each respective switch when the switch is turned on, thereby increasing the current drive capability of an active load connected to the transistor, wherein
    the switches are turned on in stages, thereby increasing the number of added load elements causing the current to flow until the negative offset voltage becomes the positive offset voltage, when the state is detected.

5. The amplifying device according to claim 4, wherein the state detecting unit includes:
a comparison unit that compares the first output voltage of the first amplifying unit and a predetermined voltage value and outputs a detection signal indicating that the state has been detected when the first output voltage of the first amplifying unit is higher than the predetermined voltage value; and
a switching control unit that controls switching of the switches based on the detection signal.

6. The amplifying device according to claim 5, wherein the switching control unit includes:
a slope voltage generating unit that, on receiving the detection signal, generates a slope voltage having a value that increases in accordance with an elapsed time;
a reference voltage generating unit that generates a reference voltage; and
a switch drive unit that compares the slope voltage and the reference voltage and switches the switch on when the slope voltage becomes higher than the reference voltage, wherein
the switching control unit comprises an analog circuit.

7. The amplifying device according to claim 6, wherein the slope voltage generating unit:
starts up on receiving the detection signal,
outputs 0 volts when the input voltage is at a high potential level, and
generates the slope voltage that gradually rises from 0 volts with the elapsed time when the input voltage is at a low potential level.

8. The amplifying device according to claim 6, wherein the reference voltage generating unit generates first and second reference voltages in order of ascending value as a plurality of reference voltages of differing values,
the offset voltage correcting unit includes first and second switches and first and second load elements corresponding to the first and second reference voltages, and
the switch drive unit adds the first load element by turning on the first switch as a first switching control, thereby increasing the current drive capability of the active load connected to one of the transistors of the differential pair, when the slope voltage is higher than the first reference voltage, and
the switch drive unit adds the second load element by turning on the second switch as a second switching control, thereby further increasing the current drive capability of the active load, when the slope voltage rises despite carrying out the first switching control, and the slope voltage becomes higher than the second reference voltage.

9. The amplifying device according to claim 5, wherein the switching control unit comprises a digital circuit that, on receiving the detection signal, causes the switch to be turned on by generating a level shifting signal of which the level is shifted at constant time intervals.

10. The amplifying device according to claim 1, wherein the amplifying device operates on a single power supply.

11. An amplifying device that operates on a single power supply, the amplifying device comprising:
a first amplifying unit having a differential pair of transistors, each having a control electrode, the first amplifying unit amplifying a difference between voltages at the control electrodes, and outputting respective corresponding first and second output voltages;
a second amplifying unit that amplifies the first output voltage of the first amplifying unit;
a first reference voltage generating circuit that generates a first reference voltage higher than the first output voltage;
a first comparator circuit that compares the first output voltage and a first reference voltage, and when the first output voltage is higher, outputs a detection signal indicating a state wherein a negative offset voltage has occurred, the negative offset voltage defined as a voltage difference by which the second output voltage is lower than the input voltage, and a low potential level of the input voltage is lower than the absolute value of the negative offset voltage;
a slope voltage generating unit that, on receiving the detection signal, generates a slope voltage of which the value increases in accordance with an elapsed time;
a second reference voltage generating circuit that generates a second reference voltage;
a second comparator circuit that compares the slope voltage and the second reference voltage and outputs a predetermined level signal when the slope voltage is higher;
a latch circuit that latches the predetermined level signal;
a switch circuit that conducts in accordance with the latched predetermined level signal; and
an offset voltage correcting unit, connected to the switch circuit, that corrects the negative offset voltage to a positive offset voltage, defined as a positive voltage difference of the second output voltage relative to the input voltage, when the switch circuit is turned on.

12. The amplifying device according to claim 11, wherein the amplifying device operates on a single power supply.

13. An offset voltage correction method of an amplifying device, comprising the steps of:
amplifying a difference between input voltages of a differential pair of transistors to output a first output voltage, and
amplifying the first output voltage to output a second output voltage,
detecting a state when a negative offset voltage occurs, the negative offset voltage defined as a voltage difference by which the second output voltage is lower than the input voltage, wherein a low potential level of the input voltage is lower than the absolute value of the negative offset voltage, and
when the state is detected, correcting the negative offset voltage to a positive offset voltage, the positive offset voltage defined as a voltage difference by which the second output voltage is higher than the input voltage.

14. The offset voltage correction method according to claim 13, wherein the negative offset voltage is corrected to the positive offset voltage by gradually raising the negative offset voltage.

15. The offset voltage correction method according to claim 13, wherein the positive offset voltage is corrected by gradually raising the negative offset voltage after setting in advance that the negative offset voltage is output from the amplifying device.

16. The offset voltage correction method according to claim 13, wherein the amplifying device operates on a single power supply.

* * * * *